(12) United States Patent
Sarfert et al.

(10) Patent No.: US 11,454,675 B2
(45) Date of Patent: Sep. 27, 2022

(54) METHOD FOR DETERMINING THE CAPACITY OF AN ELECTRICAL ENERGY STORAGE UNIT

(71) Applicant: Robert Bosch GmbH, Stuttgart (DE)

(72) Inventors: Christel Sarfert, Korntal-Muenchingen (DE); Ganesh Susmitha, Stuttgart (DE); Shashank Holavanahalli, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/160,602

(22) Filed: Jan. 28, 2021

(65) Prior Publication Data

US 2021/0247452 A1 Aug. 12, 2021

(30) Foreign Application Priority Data

Feb. 7, 2020 (DE) .................... 10 2020 201 508.2

(51) Int. Cl.
*G01R 31/387* (2019.01)
*G01R 31/392* (2019.01)
*H01M 10/44* (2006.01)

(52) U.S. Cl.
CPC ......... *G01R 31/387* (2019.01); *G01R 31/392* (2019.01); *H01M 10/44* (2013.01)

(58) Field of Classification Search
None
See application file for complete search history.

(56) References Cited

U.S. PATENT DOCUMENTS

2009/0254290 A1* 10/2009 Kim .................... H01M 10/48
702/63

FOREIGN PATENT DOCUMENTS

| CN | 103399277 A | 11/2013 |
|---|---|---|
| CN | 108196200 A | 6/2018 |
| DE | 10203810 A1 | 1/2003 |
| DE | 102007050346 A1 | 4/2009 |
| DE | 102011054456 A1 | 5/2012 |
| DE | 102014210603 A1 | 12/2015 |
| EP | 3064952 A1 | 9/2016 |

* cited by examiner

*Primary Examiner* — Jas A Sanghera
(74) *Attorney, Agent, or Firm* — Michael Best & Friedrich LLP

(57) ABSTRACT

A method is described for determining the capacity of an electrical energy storage unit, which method comprises the steps:
a) determining a first capacity value of the electrical energy storage unit using a first mathematical model based at least on an operating time and/or on a charging throughput of the electrical energy storage unit;
b) determining a second capacity value of the electrical energy storage unit using a second mathematical model based at least on a second charging throughput value of the electrical energy storage unit and on a state-of-charge difference, which is obtained from the states of charge at two different time instants;
c) obtaining a correction factor for determining a capacity value using the first mathematical model on the basis of the determined first capacity value and the determined second capacity value;
d) determining a third capacity value of the electrical energy storage unit using the first mathematical model based at least on the obtained correction factor and on the operating time of the electrical energy storage unit and/or on a third charging throughput value of the electrical energy storage unit.

8 Claims, 2 Drawing Sheets

METHOD FOR DETERMINING THE CAPACITY OF AN ELECTRICAL ENERGY STORAGE UNIT

BACKGROUND OF THE INVENTION

The present invention is based on a method for determining the capacity of an electrical energy storage unit.

Increasing electrification, in particular in the vehicle and automotive sector, has resulted in increasing use of mobile electrical energy storage systems. In order to guarantee the safety and lifetime of the electrical energy storage system, it is necessary to meet specified limit values, for instance voltage and state-of-charge limit values, especially in the case of increasingly used lithium-ion technology. In addition, it is of interest in particular to users of these electrical energy storage systems to know accurately the capacity, i.e. the storage capacity, of the electrical energy storage units of the associated electrical energy storage system. To achieve this, a battery management system performs relevant updates of the capacity values of the electrical energy storage units, usually at irregular intervals. These capacity values can be used, for example, to show a user a remaining range left to an electrically powered vehicle. The more frequently these updates can be performed, the more accurately the vehicle range can be shown to the user. In addition, it is possible by means of appropriate feedback to improve the accuracy of a mathematical model used to determine the capacity.

Document CN108196200 describes a method for determining the capacity of a lithium-ion battery.

Document CN103399277 describes a method for determining the capacity of a battery.

SUMMARY OF THE INVENTION

A method having the features of the independent claim is disclosed.

Said method for determining the capacity comprises the steps described below.

A first capacity value of the electrical energy storage unit is determined using a first mathematical model, which first model is based at least on an operating time of the electrical energy storage unit and/or on a charging throughput of the electrical energy storage unit. The operating time of the electrical energy storage unit refers here in particular to the time that the electrical energy storage unit is fitted in an electrical energy storage system. The charging throughput of the electrical energy storage unit can be determined, for example, by integrating over time the current that has flowed into and out of the electrical energy storage unit.

The first mathematical model is preferably an empirical model that is created by means of laboratory trials and that defines, for example, the dependency of the capacity of an electrical energy storage unit as a function of the operating time and the charging throughput.

In addition, a second capacity value of the electrical energy storage unit is determined using a second mathematical model, where the first mathematical model and the second mathematical model are different. Said second model is based at least on a second charging throughput value of the electrical energy storage unit and on a state-of-charge difference. The state-of-charge difference is calculated here from the state-of-charge values at two different time instants.

The second mathematical model is preferably a mathematical model that uses actual measurement values for current and voltage in order to determine the capacity. It should be noted here that the voltage measurement values should preferably be values of the voltage of the electrical energy storage unit in the resting state.

In order to correct the determination of a capacity value using the first mathematical model, a correction factor is obtained on the basis of the determined first capacity value and the determined second capacity value, in order to improve the determination of the capacity value using the first mathematical model.

Then a third capacity value of the electrical energy storage unit is determined using the first mathematical model, with this determination in turn being based on the operating time and/or on the charging throughput of the electrical energy storage unit, and on the determined correction factor to improve the determination result.

The method is advantageous because more accurate values of the capacity are determined by combining two different methods for determining the capacity. This is especially advantageous if, once the correction factor for the first mathematical model has been obtained, just this model continues to be used for a certain time to determine the capacity because no suitable resting-voltage values can be obtained for the second model.

The subject matter of the dependent claims contains further advantageous embodiments of the present invention.

Open-circuit voltage values from a modelled open-circuit voltage characteristic curve are expediently used to determine the states of charge at the different time instants. This means that the second capacity value can be determined more quickly because there is no need to wait for a stationary state of the electrical energy storage unit, or rather makes determining the second capacity value even possible at all, since continual use of the electrical energy storage unit may mean that suitable resting-voltage values cannot be attained.

The modelled open-circuit voltage characteristic curve is expediently divided into different regions. There are first regions, the open-circuit voltage values of which are used to determine the states of charge, and there are second regions, the open-circuit voltage values of which are not used to determine the states of charge. For these second regions, measured values of the voltage of the electrical energy storage unit are used instead to determine the states of charge. This is advantageous because first regions, in which the representation of the open-circuit voltage curve of the electrical energy storage unit contains fewer errors, are thereby used to determine the capacity, whereas second regions, in which the representation contains more errors, is not used for this purpose. The capacity is hence determined more accurately.

The first regions expediently include the open-circuit voltage range of 4 Volts to 3.8 Volts and of 3.7 Volts to 3.6 Volts. Representation of the open-circuit voltage characteristic curve that contains fewer errors is possible in these regions, and therefore it is possible to determine the capacity values accurately.

The method is expediently performed continuously in order to improve the determination of the capacity continuously and hence to achieve a more accurate result in every repetition process. This is relevant in particular when the electrical energy storage unit is in operation or in use for a long period, in order to have up-to-date and accurate capacity values always available.

The method can be implemented by a computer, for instance.

The subject of the disclosure also includes a computer program that is configured to perform all the steps of the method described above. The stated advantages can hence be achieved.

The subject of the disclosure also includes a machine-readable storage medium on which the computer program is stored.

The subject of the disclosure also includes a device for determining the capacity of an electrical energy storage unit, comprising at least one means that is configured to perform all the steps of the method described above. The stated advantages can hence be achieved. In particular, the at least one means may be an electronic control unit.

The at least one means may comprise, for example, a battery management controller and associated power electronics, for instance an inverter, and also current sensors and/or voltage sensors and/or temperature sensors. In addition, an electronic control unit, in particular in the form of a battery management controller, can be such a means.

An electronic control unit can refer to, in particular, an electronic controller that comprises, for example, a microcontroller and/or an application-specific hardware module, e.g. an ASIC, but equally it can include a programmable logic controller.

The subject of the disclosure also includes an electrical energy storage system that comprises an electrical energy storage unit and the described device. The stated advantages can hence be achieved.

In particular, an electrical energy storage unit can refer to an electrochemical battery cell and/or to a battery module containing at least one electrochemical battery cell and/or to a battery pack containing at least one battery module. For example, the electrical energy storage unit may be a lithium-based battery cell or a lithium-based battery module or a lithium-based battery pack. In particular, the electrical energy storage unit may be a lithium-ion battery cell or a lithium-ion battery module or a lithium-ion battery pack. Furthermore, the battery cell may be a rechargeable battery of type lithium-polymer, nickel-metal hydride, lead, lithium-air or lithium-sulfur, or quite generally may be a rechargeable battery of any electrochemical composition.

BRIEF DESCRIPTION OF THE DRAWINGS

Advantageous embodiments of the invention are described in more detail in the following description and are shown in the figures,
in which.

DETAILED DESCRIPTION

In all the figures, the same reference signs denote identical device components or identical method steps.

Figure 1:
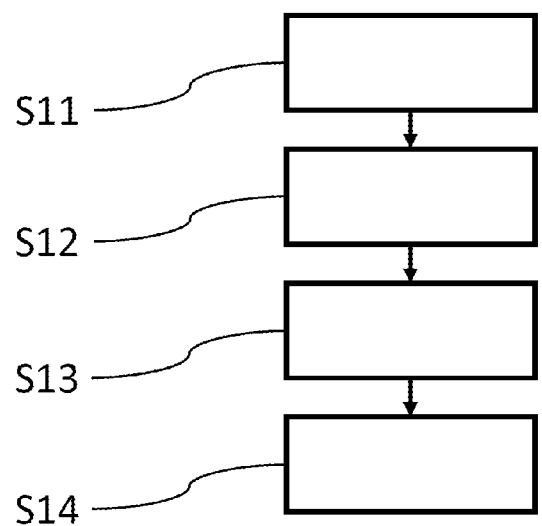
FIG. 1 is a flow diagram of the disclosed method according to an embodiment.

FIG. 1 shows a flow diagram of the disclosed method for determining the capacity of an electrical energy storage unit according to an embodiment.

In a first step S11, a first capacity value of the electrical energy storage unit is determined using a first mathematical model based at least on an operating time and/or on a charging throughput of the electrical energy storage unit.

The first mathematical model may have the following form:

$$C(t) = \frac{C2 - C1}{t2 - t1} t + C2$$

It is assumed here that the capacity $C(t)$ of the electrical energy storage unit depends linearly on the operating time $t$. The capacity thus decreases linearly with increasing operating time. $C2$ and $C1$ are here capacity values, and $t2$ and $t1$ the corresponding operating times at which these capacity values were acquired, where $t2$ denotes a later time instant than $t1$. This model determination can be carried out in laboratory trials, for instance. Thus the first mathematical model can be used to determine a first capacity value of the electrical energy storage unit.

In a second step S12, a second capacity value of the electrical energy storage unit is determined using a second mathematical model based at least on a second charging throughput value of the electrical energy storage unit and on a state-of-charge difference. Said state-of-charge difference is obtained here from the states of charge at two different time instants.

The second mathematical model may have the following form, for example:

$$Q_{cell} = \frac{\frac{1}{36} \cdot \int_{t3}^{t4} I dt}{SOC(OCVz)_{t4} - SOC(OCVz)_{t3}}$$

where Qcell is the capacity value determined by the second mathematical model, and the time instants $t3$ and $t4$ are the two different time instants. The electrical current is integrated over time between the two time instants $t3$ and $t4$ in order to determine the net amount of charge that has flowed. Dividing by the state-of-charge difference between the two time instants $t3$ and $t4$ then yields the second capacity value.

Figure 3:
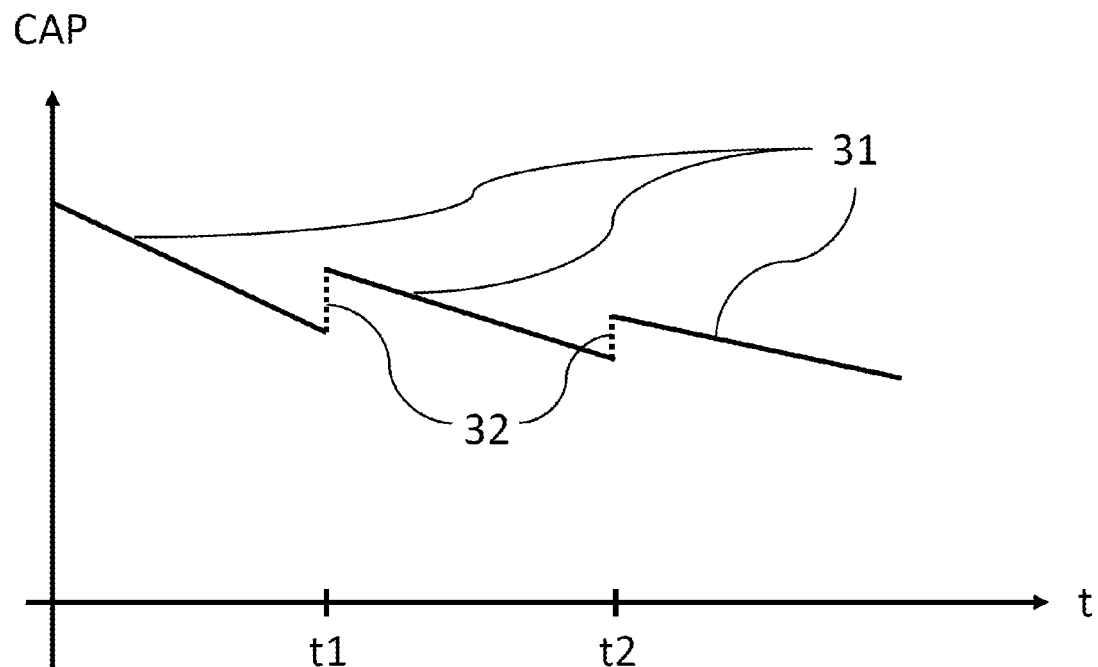
FIG. 3 is a schematic diagram of a variation of the capacity of an electrical energy storage unit according to the first mathematical model including correction factor.

Then in a third step S13, a correction factor for determining a capacity value using the first mathematical model is obtained on the basis of the determined first capacity value and the determined second capacity value. This is also illustrated in FIG. 3.

In a fourth step S14, a third capacity value of the electrical energy storage unit is determined using the first mathematical model, this being done on the basis of the correction factor obtained for the first mathematical model and on the operating time and/or on a third charging throughput value of the electrical energy storage unit.

The third capacity value determined in this manner can be used, for example, in an electronic control unit for better prediction of lifetime and/or range, and can improve the prediction of the power available, allowing the electrical energy storage unit to be operated in an improved way.

Figure 2:
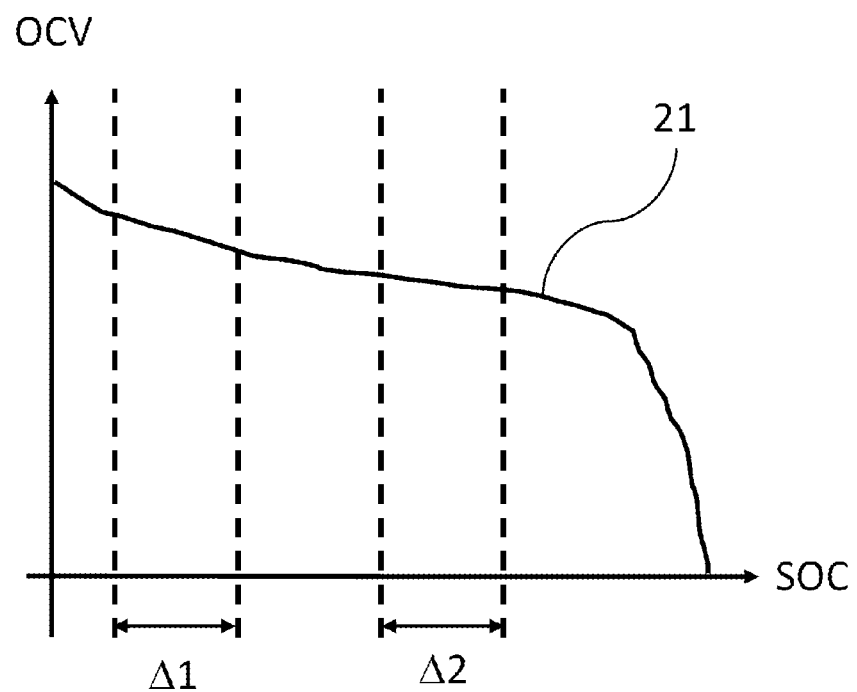
FIG. 2 is a schematic diagram of a modelled open-circuit voltage characteristic curve containing two first regions and three second regions.

FIG. 2 shows a schematic diagram of a modelled open-circuit voltage characteristic curve 21 containing two first regions 41, 42, the open-circuit voltage values of which are used to determine the states of charge, and three second regions, the open-circuit voltage values of which are not used to determine the states of charge. The values of the open-circuit voltage are plotted on the vertical axis OCV, and the state-of-charge values are plotted on the horizontal axis SOC, resulting in the open-circuit voltage characteristic curve 21.

FIG. 3 shows a schematic diagram of a capacity variation 31 of an electrical energy storage unit according to the first mathematical model including correction factors 32, which correction factors are obtained at two different time instants t1 and t2. The values of the capacity of the electrical energy storage unit that are obtained from the first mathematical model are plotted on the vertical axis CAP, and the operating time of the electrical energy storage unit is plotted along the horizontal axis t, resulting in the capacity variation 31.

Including the correction factor, the model cited above by way of example has the following form:

$$C(t) = \frac{C2 + \Delta Ckorr - C1}{t2 - t1} t + C2$$

where $\Delta Ckorr$ denotes the relevant correction factor. For FIG. 3, this means that $\Delta Ckorr$ is a positive value, because the first mathematical model has overestimated the loss in capacity over time. The model can be improved by the disclosed method, resulting in more accurate capacity values.

Figure 4:
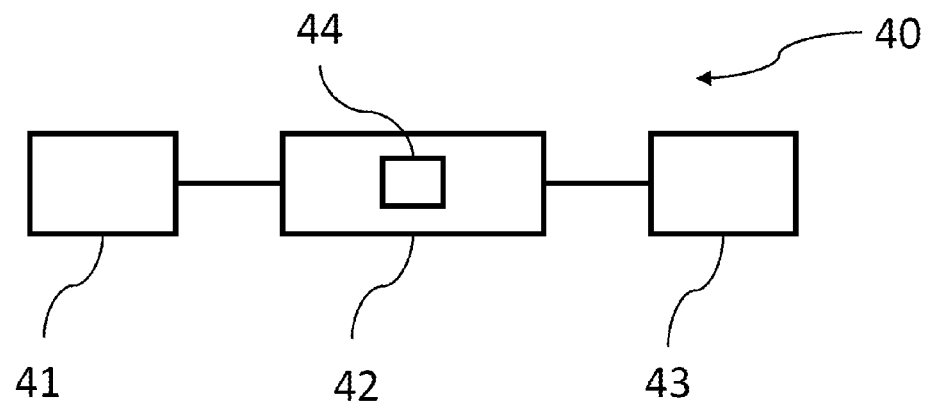
FIG. 4 is a schematic diagram of the disclosed electrical energy storage system according to an embodiment.

FIG. 4 shows a schematic diagram of the disclosed electrical energy storage system 40 according to an embodiment. The electrical energy storage system 40 comprises an electrical energy storage unit 41 and a device 42 for determining the capacity of the electrical energy storage unit. Said device 42 comprises a means 44 that is configured to perform the steps of the disclosed method. The device 44 in turn controls a power-electronics component 43 that, for instance, regulates the supply of energy to an electric motor.

The invention claimed is:

1. A method for determining the capacity of an electrical energy storage unit (41), the method comprising the steps of:
   a) determining, via a computer, a first capacity value of the electrical energy storage unit (41) using a first mathematical model based at least on an operating time, on a charging throughput of the electrical energy storage unit (41), or both;
   b) determining, via the computer, a second capacity value of the electrical energy storage unit (41) using a second mathematical model based at least on a second charging throughput value of the electrical energy storage unit (41) and on a state-of-charge difference, which is obtained from the states of charge at two different time instants;
   c) obtaining, via the computer, a correction factor (32) for determining a capacity value using the first mathematical model on the basis of the determined first capacity value and the determined second capacity value;
   d) determining, via a computer, a third capacity value of the electrical energy storage unit (41) using the first mathematical model based at least on the obtained correction factor (32) and on the operating time of the electrical energy storage unit (41), on a third charging throughput value of the electrical energy storage unit (41), or both.

2. The method according to claim 1, wherein in step b), open-circuit voltage values from a modelled open-circuit voltage characteristic curve (21) are used to determine the states of charge.

3. The method according to claim 2, wherein the modelled open-circuit voltage characteristic curve (21) is divided into different regions, wherein there is at least one first region ($\Delta 1$, $\Delta 2$), the open-circuit voltage values of which are used to determine the states of charge, and wherein there is at least one second region, the open-circuit voltage values of which are not used to determine the states of charge, but instead measured values of the voltage of the electrical energy storage unit (41) are used to determine the states of charge.

4. The method according to claim 3, wherein the at least one first region ($\Delta 1$, $\Delta 2$) includes the open-circuit voltage range of 4 Volts to 3.8 Volts and the open-circuit voltage range of 3.7 Volts to 3.6 Volts.

5. The method according to claim 1, wherein the method is performed continuously.

6. A non-transitory, computer-readable storage medium containing instructions which when executed by a computer cause the computer to
   determine a first capacity value of the electrical energy storage unit (41) using a first mathematical model based at least on an operating time, on a charging throughput of the electrical energy storage unit (41), or both;
   determine a second capacity value of the electrical energy storage unit (41) using a second mathematical model based at least on a second charging throughput value of the electrical energy storage unit (41) and on a state-of-charge difference, which is obtained from the states of charge at two different time instants;
   obtain a correction factor (32) for determining a capacity value using the first mathematical model on the basis of the determined first capacity value and the determined second capacity value;
   determine a third capacity value of the electrical energy storage unit (41) using the first mathematical model based at least on the obtained correction factor (32) and on the operating time of the electrical energy storage unit (41), on a third charging throughput value of the electrical energy storage unit (41), or both.

7. A device (42) for determining the capacity of an electrical energy storage unit (41), comprising at least one means (44), an electronic control unit configured to
   determine a first capacity value of the electrical energy storage unit (41) using a first mathematical model based at least on an operating time, on a charging throughput of the electrical energy storage unit (41), or both;
   determine a second capacity value of the electrical energy storage unit (41) using a second mathematical model based at least on a second charging throughput value of the electrical energy storage unit (41) and on a state-of-charge difference, which is obtained from the states of charge at two different time instants;
   obtain a correction factor (32) for determining a capacity value using the first mathematical model on the basis of the determined first capacity value and the determined second capacity value;
   determine a third capacity value of the electrical energy storage unit (41) using the first mathematical model based at least on the obtained correction factor (32) and on the operating time of the electrical energy storage unit (41), on a third charging throughput value of the electrical energy storage unit (41), or both.

8. An electrical energy storage system (40) comprising an electrical energy storage unit (41) and a device (42) according to claim 7.

\* \* \* \* \*